United States Patent
Hsiao

(10) Patent No.: US 7,396,477 B2
(45) Date of Patent: Jul. 8, 2008

(54) METHOD FOR MANUFACTURING A THERMAL INTERFACE MATERIAL

(75) Inventor: Bor-Yuan Hsiao, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/433,655

(22) Filed: May 12, 2006

(65) Prior Publication Data
US 2007/0004081 A1    Jan. 4, 2007

(30) Foreign Application Priority Data
Jun. 30, 2005    (CN) ..................... 2005 1 0035666

(51) Int. Cl.
*C23F 1/00*    (2006.01)
(52) U.S. Cl. .................. 216/2; 216/8; 216/74; 216/96; 977/742
(58) Field of Classification Search ...... 216/2, 216/8, 74, 96; 977/742
See application file for complete search history.

(56) References Cited

U.S. PATENT DOCUMENTS

| 6,407,922 | B1 | 6/2002 | Eckblad et al. | |
|---|---|---|---|---|
| 2003/0111333 | A1 | 6/2003 | Montgomery | |
| 2004/0266065 | A1* | 12/2004 | Zhang et al. | 438/122 |
| 2005/0255313 | A1* | 11/2005 | Kyotani et al. | 428/338 |
| 2006/0054490 | A1* | 3/2006 | Montgomery et al. | 204/164 |
| 2006/0073332 | A1* | 4/2006 | Huang et al. | 428/367 |
| 2006/0251897 | A1* | 11/2006 | Pan et al. | 428/408 |

* cited by examiner

*Primary Examiner*—Binh X. Tran

(57) ABSTRACT

An exemplary method for manufacturing a thermal interface material includes the steps of: providing a first substrate having a first surface and an opposite second substrate having an opposite second surface spaced apart a predetermined distance; forming a number of carbon nanotubes from one of the first the second surfaces; forming a composite material by filling interstices between the carbon nanotubes with a liquid state base material; curing the liquid state base material filled in the interstices between the carbon nanotubes; and removing the first and the second substrates from the composite material.

20 Claims, 2 Drawing Sheets

```
providing a first substrate having a first
surface and an opposite second substrate
having a second surface facing the first
surface of the first substrate, the second
substrate spaced apart a predetermined
distance from the first substrate
                    ↓
forming a plurality of carbon nanotubes from
one of the first and the second surfaces
                    ↓
filling interstices between the carbon
nanotubes with a liquid state base material
                    ↓
curing the liquid state base material filled in
the intertices between the carbon nanotubes
to form a composite material
                    ↓
removing the first and the second substrates
from the composite material
```

METHOD FOR MANUFACTURING A THERMAL INTERFACE MATERIAL

TECHNICAL FIELD

The present invention relates to methods of manufacturing thermal interface materials, and more particularly to a method for manufacturing a thermal interface material having carbon nanotubes that conduct heat.

BACKGROUND

Electronic components such as semiconductor chips are becoming progressively smaller with each new product release, while at the same time the heat dissipation requirements of semiconductor chips are increasing due to their improved capacity to process more data faster. Commonly, a thermal interface material is utilized between an electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/m·K (watts/meter·Kelvin) at room temperature. However, if carbon nanotubes are filled in a base material randomly, each of heat conduction paths within the base material may include two or more adjoining carbon nanotubes. The junction between each two adjoining carbon nanotubes represents a point of thermal resistance when heat travels from one of the carbon nanotubes to the other carbon nanotube. If a heat conduction path contains more than one point of thermal resistance, the sum total of thermal resistance for the heat conduction path may be significant. Further, if the base material contains a large proportion of heat conduction paths having points of thermal resistance, the overall thermal resistance of the filled base material may be unacceptably high.

Because of the above-described problems, a method for producing an aligned carbon nanotube thermal interface structure has been developed. In a batch process, a capacitor is immersed in a bath containing a slurry of thermoplastic polymer containing randomly oriented carbon nanotubes, and is then energized to create an electrical field to orient the carbon nanotubes prior to curing. However, the method necessarily involves rearranging the randomly oriented carbon nanotubes by application of the electrical field. Variations in the electrical field intensity and direction are liable to occur, and this can lead to asymmetric distributions of the carbon nanotubes in the thermal interface structure. When this happens, the overall thermal resistance of the thermal interface structure is increased.

What is needed, therefore, is a method for manufacturing a thermal interface material which ensures that carbon nanotubes in the thermal interface material have good alignment.

SUMMARY

In a preferred embodiment, a method for manufacturing a thermal interface material includes the steps of: providing a first substrate having a first surface and an opposite second substrate having a second surface facing to the first surface of the first substrate, the second substrate spaced apart a predetermined distance from the first substrate; forming a plurality of carbon nanotubes from one of the first and the second surfaces; filling interstices between the carbon nanotubes with a liquid state base material; curing the liquid state base material filled in the interstices between the carbon nanotubes to form a composite material; and removing the first and the second substrates from the composite material.

Other advantages and novel features will become more apparent from the following detailed description when taken in conjunction with the accompanying drawings.

BRIEF DESCRIPTION OF THE DRAWINGS

The components shown are not necessarily to scale, the emphasis instead being placed upon clearly illustrating the principles of the present method for manufacturing a thermal interface material. Moreover, like reference numerals designate corresponding parts throughout the several views.

The exemplifications set out herein illustrate at least one preferred embodiment of the invention, in one form, and such exemplifications are not to be construed as limiting the scope of the invention in any manner.

DETAILED DESCRIPTION OF PREFERRED EMBODIMENTS

Embodiments of the present method for manufacturing a thermal interface will now be described in detail below and with reference to the drawings.

Figure 1:
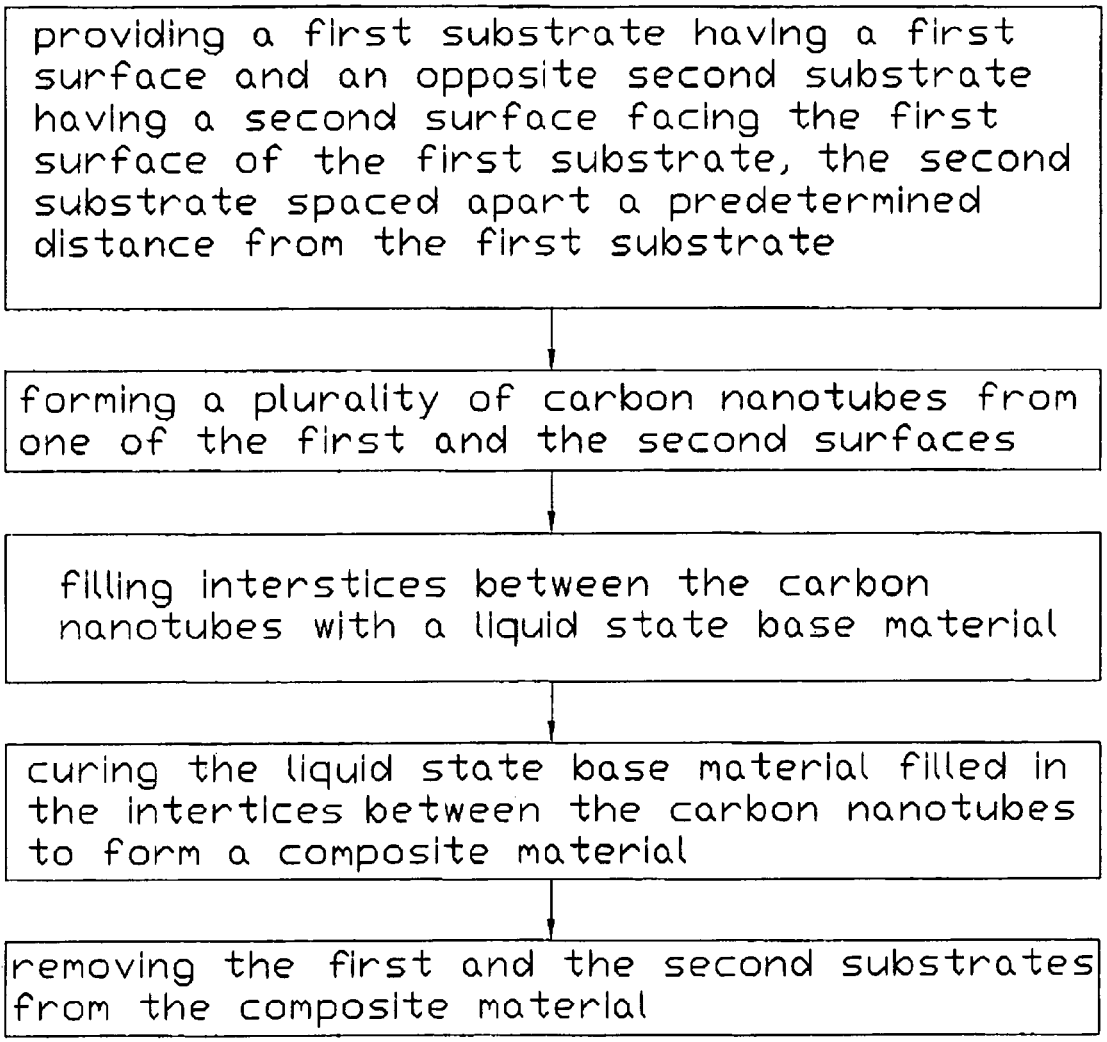
FIG. 1 is a flow chart of a method for manufacturing a thermal interface material in accordance with a preferred embodiment of the present invention.

Referring to FIG. 1, a method for manufacturing a thermal interface material is provided. The method comprises the steps of providing a first substrate having a first surface and an opposite second substrate having a second surface facing the first surface of the first substrate, the second substrate spaced apart a predetermined distance from the first substrate; forming a plurality of carbon nanotubes from one of the first and the second surfaces; filling interstices between the carbon nanotubes with a liquid state base material; curing the liquid state base material filled in the interstices between the carbon nanotubes to form a composite material; and removing the first and the second substrates from the composite material. The predetermined distance between the first and second substrates corresponds to a thickness of the thermal interface material obtained, and is preferably in the range from 1 μm to 100 μm.

In addition, the method for manufacturing the thermal interface material preferably further comprises etching the thermal interface material after the first and the second substrates have been removed. That is, after the first and the second substrates are removed, two opposite surfaces of the thermal interface material are exposed. Treatment of the opposite surfaces such as by way of etching can ensure that tips of the carbon nanotubes are exposed from the two opposite surfaces.

Figure 2:
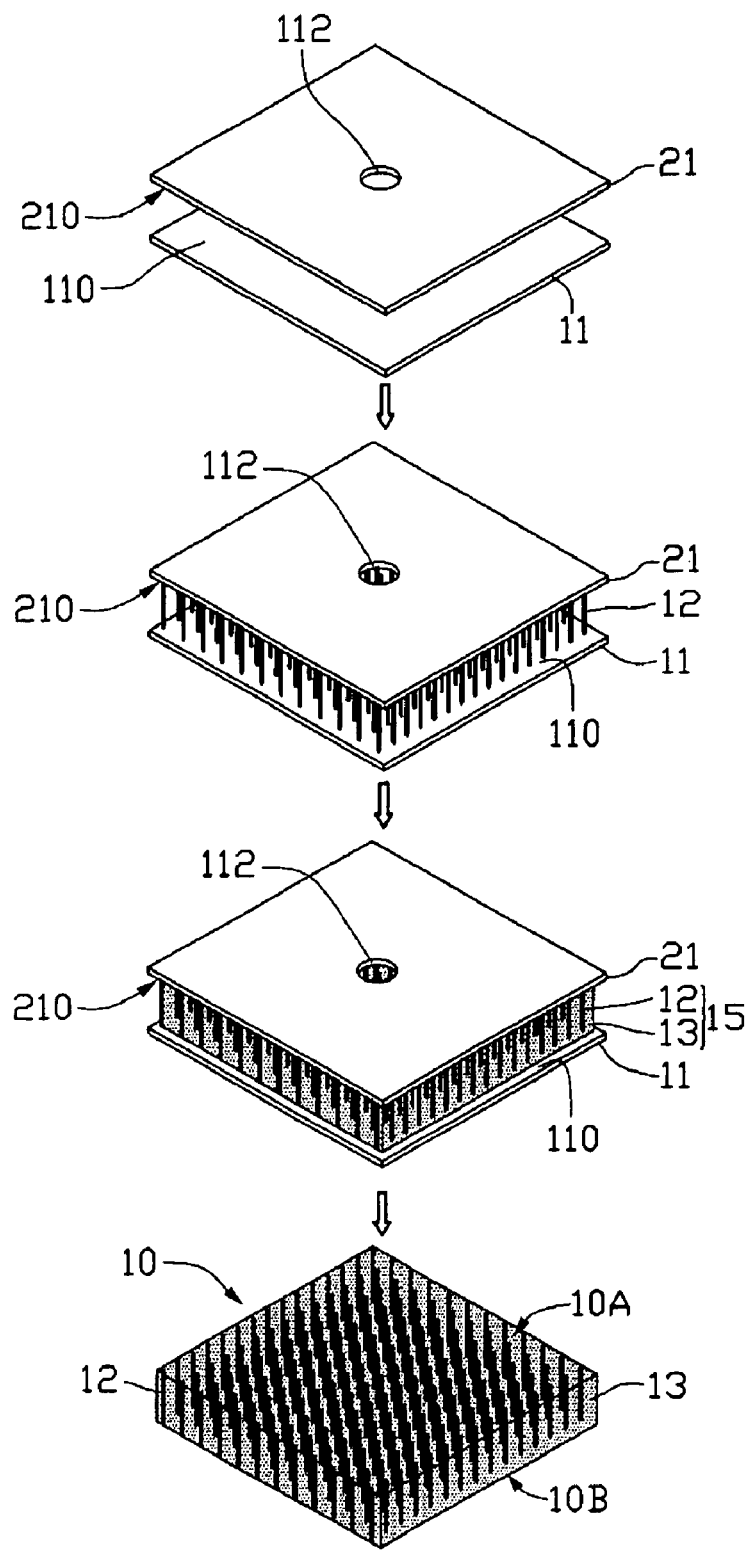
FIG. 2 shows schematic, isometric views of structures used and obtained in various successive stages of the method of FIG. 1.

Referring to FIG. 2, details of steps of the method for manufacturing the thermal interface material are described below and by reference to various embodiments. In the preferred embodiment, a plurality of carbon nanotubes are grown from a surface 110 of a first substrate 11 by deposition.

First, there is a step of providing the first substrate 11 having the first surface 110 and an opposite second substrate 21 having a second surface 210 facing the first surface 110 of the first substrate 11, the second substrate 21 being spaced apart a predetermined distance from the first substrate 11. In detail, the first substrate 11 and the second substrate 21 are fixed essentially parallel to and spaced apart from each other a predetermined distance by a carrier (not shown), with the second surface 210 of the second substrate 21 being opposite to the first surface 110 of the first substrate 11. In the preferred embodiment, the predetermined distance is 30 µm. Preferably, one of the first substrate 11 and the second substrate 21 further comprises a through hole 112. In the illustrated embodiment, the second substrate 21 comprises the through hole 112. The two substrates 11 and 21 can each be a silicon sheet.

Each of the first substrate 11 and the second substrate 21 is made from a material selected from the group comprising glass, silicon, and metal. The glass can be quartz glass. The metal is selected from the group comprising Ta (tantalum), Ni (nickel), Ag (silver), Fe (iron), Cu (copper), and any suitable alloy thereof. The first substrate 11 and the second substrate 21 can be made from a same material or different materials.

Second, there is a step of forming a plurality of carbon nanotubes 12 from the first substrate 11, which is preferably via a chemical vapor deposition method. This step can be performed by depositing a catalyst layer on the first substrate 11, and then introducing a carbon source gas and growing a plurality of carbon nanotubes 12 from the catalyst layer via chemical vapor deposition. During the aforesaid process, the carbon nanotubes 12 can be grown to almost meet or meet the second surface 210 by controlling a reaction time of the chemical vapor deposition. Detailedly, an iron film having a thickness of 5 nm is coated on the first substrate 11, and is annealed in air at 300 degrees Celsius to thereby form the catalyst layer. Then the first substrate 11 with the catalyst layer disposed thereon is placed in a chemical vapor deposition chamber (not shown), and ethylene (a carbon source gas) is provided in the chemical vapor deposition chamber at a temperature of 700 degrees Celsius to grow the plurality of carbon nanotubes 12. In the preferred embodiment, the reaction time of the chemical vapor deposition is approximately 5 minutes, and the height of the carbon nanotubes 12 is approximately 30 µm. It is noted that the step of forming the plurality of carbon nanotubes 12 is not limited to the aforesaid method. Other methods, for example a plasma assisted chemical vapor deposition method, can also be employed.

Preferably, the plurality of carbon nanotubes 12 comprise a carbon nanotube array, in which the carbon nanotubes 12 are substantially parallel to each other and perpendicular to the first surface 110 of the first substrate 11 and the second surface 210 of the second surface 21.

Third, there is a step of filling interstices between the carbon nanotubes 12 with a liquid state base material 13. The base material 13 can be selected from a macromolecular material or a phase change material. The macromolecular material is selected from the group comprising silicone, polyester, polyvinyl chloride (PVC), polyvinyl alcohol (PVA), polyethylene, polypropylene, epoxy resin, polycarbonate (PC), polyoxymethylene, and a polyacetal. The phase change material is selected from the group comprising paraffin, polyolefin, low molecular weight polyester, low molecular weight epoxy resin, and a low molecular weight acrylic. In the preferred embodiment, epoxy resin is employed as the base material 13. Further, a hardener can be added into the epoxy resin. The second substrate 21 comprises the through hole 112, and the liquid state base material 13 is the filled in the interstices between the carbon nanotubes 12 via the through hole 112. In other embodiments, the filling step can be performed by immersing the carbon nanotubes 12 into a melt or solution of the base material 13 at a temperature higher than a phase change or melt temperature of the base material 13. Thereby, the melt or solution of the base material 13 permeates into the interstices between the carbon nanotubes 12. It is noted that, if a solution of the base material 13 is employed, the solvent of the solution should be some kind of suitable volatile substance. This kind of method can be applied in the case when the substrates 11 and 21 do not comprise the through hole 112.

Fourth, there is a step of curing the liquid state base material 13 filled in the interstices between the carbon nanotubes 12, in order to form a composite material 15. The curing step can be performed by methods such as a heat hardening method or an ultraviolet (UV) curing method. In the preferred embodiment, a heat hardening method is employed, and comprises the following steps. Firstly, the assembly comprising the plurality of carbon nanotubes 12 with the base material 13 filled therebetween and the substrates 11 and 21 is put into a thermocompressor, and heat pressed for 5 minutes at a temperature of 175 degrees Celsius under a pressure of 50 Kg/cm$^2$. Then the base material 13 is hardened for 6 hours in a vacuum oven at a temperature of 180 degrees Celsius. Thereby, the composite material 15 comprising the base material 13 and the plurality of carbon nanotubes 12 is formed.

Finally, there is a step of removing the first and the second substrates 11, 21 from the composite material 15. The first substrate 11 and the second substrate 21 are taken off from the composite material 15. Thus, a thermal interface material 10 comprising the plurality of carbon nanotubes 12 is formed, with two opposite surfaces 10A and 10B of the thermal interface material 10 being exposed.

Preferably, the method for manufacturing the thermal interface material 10 further comprises a step of etching the two opposite surfaces 10A and 10B of the thermal interface material 10. The etching step can be performed by a wet etching method, or by a dry etching method such as for example a reactive ion etching method. In the preferred embodiment, a reactive ion etching method is used. The surfaces 10A and 10B of the thermal interface material 10 are etched to ensure that tips of the carbon nanotubes 12 are exposed from the two opposite surfaces 10A and 10B.

As stated above, the method for manufacturing the thermal interface material 10 in accordance with the preferred embodiment employs the two opposite substrates 11 and 21 which are spaced apart a predetermined distance, and involves growing a plurality of carbon nanotubes 12 between the substrates 11 and 21. Therefore the lengths of the carbon nanotubes 12 can be controlled, and the corresponding thickness of the thermal interface material 10 can be accurately configured. In addition, because the interstices between the carbon nanotubes 12 are filled with the base material 13 by in-situ filling, the carbon nanotubes 12 can keep their original orientations and arrangement as grown. That is, the carbon nanotubes 12 and the base material 13 are formed together, with the carbon nanotubes 12 maintained in a uniform array. Furthermore, each the carbon nanotubes 12 of the thermal interface material 10 can form a continuous heat conduction path with high thermal conductivity between the two opposite surfaces 10A and 10B. Thereby, the overall thermal resistance of the thermal interface material 10 is low.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing a thermal interface material, comprising:
    providing a first substrate having a first surface and an opposite second substrate having a second surface facing toward the first surface of the first substrate, the second substrate spaced apart a predetermined distance from the first substrate;
    forming a plurality of carbon nanotubes from one of the first and the second surfaces;
    filling interstices between the carbon nanotubes with a liquid state base material;
    curing the liquid state base material filled in the interstices between the carbon nanotubes to form a composite material; and
    removing the first and the second substrates from the composite material.

2. The method for manufacturing a thermal interface material in accordance with claim 1, wherein the base material is filled in the interstices between the carbon nanotubes by immersing the carbon nanotubes into a melt or solution of the base material.

3. The method for manufacturing a thermal interface material in accordance with claim 1, wherein in the filling step, a hardener is added into the base material.

4. The method for manufacturing a thermal interface material in accordance with claim 1, wherein in the providing step, the first and the second surfaces are fixed parallel to and spaced apart from each other the predetermined distance by a carrier.

5. The method for manufacturing a thermal interface material in accordance with claim 1, wherein each of the first and the second substrates is made from a material selected from the group consisting of glass, silicon, and metal.

6. The method for manufacturing a thermal interface material in accordance with claim 1, wherein the plurality of carbon nanotubes comprise a carbon nanotube array.

7. The method for manufacturing a thermal interface material in accordance with claim 1, wherein the carbon nanotubes are substantially parallel to each other and substantially perpendicular to the first and the second surfaces of the first and the second substrates.

8. The method for manufacturing a thermal interface material in accordance with claim 1 wherein the predetermined distance is in the range from 1 µm to 100 µm.

9. The method for manufacturing a thermal interface material in accordance with claim 1, wherein one of the first and the second surfaces comprises a through hole.

10. The method for manufacturing a thermal interface material in accordance with claim 9, wherein the base material is filled in the interstices between the carbon nanotubes via the through hole.

11. The method for manufacturing a thermal interface material in accordance with claim 1, wherein the forming step comprises:
    depositing a catalyst layer on one of the first surface and the second surface;
    introducing a carbon source gas; and
    growing a plurality of carbon nanotubes from the catalyst layer via a chemical vapor deposition method.

12. The method for manufacturing a thermal interface material in accordance with claim 11, wherein during the growing step, the carbon nanotubes are grown until they are close to or meet the other of the first surface and the second surface by controlling a reaction time of the chemical vapor deposition.

13. The method for manufacturing a thermal interface material in accordance with claim 1, further comprising etching the thermal interface material after the removing step.

14. The method for manufacturing a thermal interface material in accordance with claim 13, wherein the etching step is performed by one of a dry etching method and a wet etching method.

15. The method for manufacturing a thermal interface material in accordance with claim 1, wherein the base material is a macromolecular material or a phase change material.

16. The method for manufacturing a thermal interface material in accordance with claim 15, wherein the base material is a macromolecular material, and the macromolecular material is selected from the group comprising silicone, polyester, polyvinyl chloride, polyvinyl alcohol, polyethylene, polypropylene, epoxy resin, polycarbonate, polyoxymethylene, and a polyacetal.

17. The method for manufacturing a thermal interface material in accordance with claim 15, wherein the base material is a phase change material, and the phase change material is selected from the group comprising paraffin, polyolefin, low molecular weight polyester, low molecular weight epoxy resin, and a low molecular weight acrylic.

18. The method for manufacturing a thermal interface material in accordance with claim 1, wherein the curing step comprises heat pressing and hardening treatments.

19. The method for manufacturing a thermal interface material in accordance with claim 18, wherein the heat pressing process comprises steps of putting the liquid state base material filled in the interstices between the carbon nanotubes into a thermocompressor and heat pressing for about 5 minutes at a temperature of about 175 degrees Celsius under a pressure of about 50 Kg/cm$^2$.

20. The method for manufacturing a thermal interface material in accordance with claim 19, wherein the method further comprises steps of putting the liquid state base material filled in the interstices between the carbon nanotubes into a vacuum over at a temperature of about 180 degrees Celsius and hardening for about 6 hours to form a composite material.

* * * * *